US011834987B2

(12) United States Patent
Forsdike et al.

(10) Patent No.: US 11,834,987 B2
(45) Date of Patent: Dec. 5, 2023

(54) ELECTRICAL CURRENT CONVERTER/RECTIFIER WITH INTEGRATED FEATURES

(71) Applicants: John P. E. Forsdike, Indianapolis, IN (US); Krishnamoorthi Sivalingam, Seletar (SG); Palanisamy Mohan Kumar, Jurong (SG); Rakesh Murali, Jurong (SG)

(72) Inventors: John P. E. Forsdike, Indianapolis, IN (US); Krishnamoorthi Sivalingam, Seletar (SG); Palanisamy Mohan Kumar, Jurong (SG); Rakesh Murali, Jurong (SG)

(73) Assignee: Rolls-Royce Corporation, Indianapolis, IN (US)

( * ) Notice: Subject to any disclaimer, the term of this patent is extended or adjusted under 35 U.S.C. 154(b) by 259 days.

(21) Appl. No.: 17/203,348

(22) Filed: Mar. 16, 2021

(65) Prior Publication Data
US 2022/0298968 A1    Sep. 22, 2022

(51) Int. Cl.
*H05K 7/20*        (2006.01)
*F02C 6/20*        (2006.01)
(Continued)

(52) U.S. Cl.
CPC ............... *F02C 6/20* (2013.01); *B23K 20/10* (2013.01); *F02C 7/32* (2013.01); *H01L 23/40* (2013.01); *H05K 7/20927* (2013.01); *B23K 2101/001* (2018.08); *B64D 2027/026* (2013.01); *F05D 2220/323* (2013.01); *F05D 2220/76* (2013.01); *H01G 9/0003* (2013.01)

(58) Field of Classification Search
None
See application file for complete search history.

(56) References Cited

U.S. PATENT DOCUMENTS 5,053,920 A * 10/1991 Staffiere .............. H01L 25/0655
257/E23.114
6,695,296 B1 * 2/2004 Runge .................... F16F 1/377
267/153

(Continued)

OTHER PUBLICATIONS

A. -C. Iradukunda et al. "A Review of Advanced Thermal Management Solutions and the Implications for Integration in High-Voltage Packages," Nov. 12, 2019 retried from https://ieeexplore.ieee.org/document/8896946 (Year: 2019).*

(Continued)

*Primary Examiner* — Kayla Mccaffrey
(74) *Attorney, Agent, or Firm* — Barnes & Thornburg LLP

(57) ABSTRACT

A propulsion system for use with an aircraft includes a gas turbine engine, an electric power system, and at least one propulsor. The gas turbine engine includes a compressor, a combustor, and a turbine. The electric power system includes a generator coupled to the gas turbine engine to generate electrical energy, power electronics connected to the generator to receive the electrical energy from the generator, and a motor configured to produce rotational energy in response to receiving electric energy from the power electronics. The propulsor is configured to use rotational energy received from the motor of the electric power system to generate thrust for propelling the aircraft.

18 Claims, 10 Drawing Sheets

(51) Int. Cl.
*B23K 20/10* (2006.01)
*H01L 23/40* (2006.01)
*F02C 7/32* (2006.01)
*B23K 101/00* (2006.01)
*B64D 27/02* (2006.01)
*H01G 9/00* (2006.01)

(56) References Cited

U.S. PATENT DOCUMENTS

| | | | |
|---|---|---|---|
| 7,106,777 | B2 | 9/2006 | Delgado, Jr. et al. |
| 7,401,643 | B2 | 7/2008 | Queheillalt et al. |
| 8,520,381 | B2* | 8/2013 | Hobein ............... H05K 7/20918 |
| | | | 361/752 |
| 9,446,475 | B2 | 9/2016 | Norfolk et al. |
| 9,564,385 | B2 | 2/2017 | Schmit et al. |
| 9,990,576 | B2 | 6/2018 | Nardi et al. |
| 10,356,914 | B2 | 7/2019 | Kocurek et al. |
| 10,518,490 | B2 | 12/2019 | Wicker et al. |
| 10,648,744 | B2 | 5/2020 | Veto et al. |
| 10,682,734 | B2 | 6/2020 | Anderson et al. |
| 10,693,201 | B2 | 6/2020 | Smoot et al. |
| 10,954,814 | B2* | 3/2021 | Alstad ....................... F02C 7/16 |
| 11,351,590 | B2* | 6/2022 | Hahnlen ................ B21D 22/02 |
| 2006/0142140 | A1 | 6/2006 | White et al. |
| 2006/0152907 | A1* | 7/2006 | Rathmann .............. H02K 11/33 |
| | | | 361/720 |
| 2008/0291640 | A1* | 11/2008 | Chen .................... H05K 3/0061 |
| | | | 29/832 |
| 2011/0220292 | A1 | 9/2011 | Short |
| 2012/0153006 | A1 | 6/2012 | Koetting et al. |
| 2016/0114439 | A1 | 4/2016 | Pal et al. |
| 2016/0183409 | A1* | 6/2016 | Zhou ................. H05K 7/20263 |
| | | | 165/104.31 |
| 2017/0067175 | A1 | 3/2017 | Jung et al. |
| 2017/0304964 | A1* | 10/2017 | Andersen .................. F28F 7/02 |
| 2018/0265206 | A1* | 9/2018 | Himmelmann ........ B64D 27/24 |
| 2018/0297144 | A1 | 10/2018 | Mayberry et al. |
| 2019/0358739 | A1 | 11/2019 | Hahnlen et al. |
| 2020/0309466 | A1* | 10/2020 | Mayberry .............. B23K 20/10 |
| 2020/0312740 | A1* | 10/2020 | Rao ..................... H01L 21/4882 |
| 2021/0129261 | A1* | 5/2021 | Mayberry ............. H01L 23/427 |

OTHER PUBLICATIONS

TWI Ltd, Webinar: CoreFlow—Technology Launch Webinar, Youtube Video, May 7, 2020, https://www.youtube.com/watch?v=zvjVkNxKSd4.

Adam Hehr, Building Fiber Optic Strain Sensors into Metal Components, Article, 2018, 3 pages.

Justin Wenning, Space-grade 3D Metal Printed Heat Exchangers, Article, 2018, 5 pages.

Adam Hehr et al., Selective Reinforcement of Aerospace Structures Using Ultrasonic Additive Manufacturing, Article, Aug. 29, 2018, Journal of Materials Engineering and Performance.

* cited by examiner

ELECTRICAL CURRENT CONVERTER/RECTIFIER WITH INTEGRATED FEATURES

FIELD OF THE DISCLOSURE

The present disclosure relates generally to hybrid electric propulsion systems and more specifically to hybrid electric propulsion systems with high power density converters.

BACKGROUND

Gas turbine engines are used to power aircraft, watercraft, power generators, and the like. Gas turbine engines typically include a compressor, a combustor, and a turbine. The compressor compresses air drawn into the engine and delivers high pressure air to the combustor. In the combustor, fuel is mixed with the high pressure air and is ignited. Products of the combustion reaction in the combustor are directed into the turbine where work is extracted to drive the compressor and, sometimes, an output shaft. Left-over products of the combustion are exhausted out of the turbine and may provide thrust in some applications.

Hybrid turbo electric propulsion systems may be used to power aircraft. In hybrid turbo electric aero-propulsion systems, a motor may be used in combination with a turbine engine to provide motive power to one or more propulsors, such as a fan or a propeller. Hybrid electric propulsion systems may rely on rectifiers or converters for converting alternating current (AC) from a generator into direct current (DC) which is then passed through high voltage cabling before being converted back into AC for use in a motor. Managing the high density heat loads, shock loads caused by high-G maneuvers or hard landings, as well as electromagnetic interference may be difficult.

SUMMARY

The present disclosure may comprise one or more of the following features and combinations thereof.

According to an aspect of the present disclosure, a propulsion system for use with an aircraft may include a gas turbine engine, an electric power system, and at least one propulsor. The gas turbine engine may include a compressor, a combustor, and a turbine. The electric power system may be coupled to the gas turbine engine to generate electrical energy. The propulsor may be configured to generate thrust for propelling the aircraft.

In some embodiments, the electric power system may include a generator, power electronics, and a motor. The generator may be coupled to the gas turbine engine to generate electrical energy. The power electronics may be connected to the generator to receive the electrical energy from the generator. The power electronics may be configured to convert the electrical energy for transferring the electrical energy between components of the electric power system. The motor may be configured to produce rotational energy in response to receiving electric energy from the power electronics. The propulsor may be configured to use rotational energy received from the motor of the electric power system to generate the thrust for propelling the aircraft.

In some embodiments, the power electronics may include electrical components and a housing. The housing may be integrated with thermal management features and shock load reinforcement using ultrasonic additive manufacturing to protect the electrical components.

In some embodiments, the housing may include a base, a cover, and vibration dampeners. The base may comprise a composite material of a first metallic material and ceramic fibers. The cover may comprise a second metallic material that extends over the electrical components mounted to the base. The vibration dampers may extend between and interconnect the base to the aircraft to minimize the vibrations transferred to the base and the cover.

In some embodiments, the base may be formed to include a cooling passageway. The cooling passageway may extend therethrough to transfer a flow of cooling fluid through the base to cool the electrical components mounted to the base.

In some embodiments, the base of the housing may include a base plate and a heat shield. The base plate may comprise the composite material and may be formed to define the cooling passageway. The heat shield may comprise a third metallic material having thermal resistance greater than the first metallic material. The heat shield may extend around an outer surface of the base plate to protect the base plate from high temperatures.

In some embodiments, the base may further include at least one heat transfer pedestal. The heat transfer pedestal may be located in a cavity formed in the base plate that is in fluid communication with the cooling passageway.

In some embodiments, the heat transfer pedestal may include a plate and a plurality of fins. The plate may be flush with an inner surface of the base plate to close an opening to the cavity. The plurality of fins may extend from the plate into the cavity so as to be in fluid communication with the cooling fluid.

In some embodiments, the plate may comprise the first metallic material and the plurality of fins may comprise a fourth metallic material. The fourth metallic material may have a thermal resistance less than the first metallic material to transfer heat from the plate to the cooling fluid.

In some embodiments, the plate may include an embedded temperature sensor. The temperature sensor may be configured to measure the temperature of the electrical components mounted to an outer surface of the plate.

In some embodiments, the system may further comprise a plurality of sensors. The plurality of sensors may each be embedded in the base plate.

In some embodiments, at least one sensor of the plurality of sensors may be a temperature sensor. In some embodiments, the plurality of sensors may be temperature sensors. The temperature sensors may be embedded in the base plate proximate to an inner surface of the base plate. The temperature sensors may be configured to measure the temperature of the electrical components mounted to the base.

In some embodiments, at least one sensor of the plurality of sensors may be a strain gauge. In some embodiments, the plurality of sensors may be strain gauges. The strain gauges may be configured to measure the strain in the base plate.

In some embodiments, the base of the housing may include a base plate and a heat shield. The base plate may comprise the composite material. The head shield may comprise a third metallic material and may extend around an outer surface of the base plate. The third metallic material may have a thermal resistance greater than the first metallic material.

In some embodiments, the base plate may be formed to define the cooling passageway and a plurality of fins. The plurality of fins may extend into the cooling passageway. The plurality of fins may comprise a fourth metallic material that has a thermal resistance less than the first metallic material.

In some embodiments, the cover may comprise layers of electromagnetic shielding material. The material may be integrated with the second metallic material of the cover to protect the electrical components from electromagnetic interference.

According to another aspect of the present disclosure, a propulsion system for use with an aircraft may comprise a gas turbine engine, an electric power system, and at least one propulsor. The electric power system may include a generator coupled to the gas turbine engine to generate electrical energy, power electronics connected to the generator to receive the electrical energy from the generator, and a motor configured to produce rotational energy in response to receiving electric energy from the power electronics. The propulsor may be configured to use rotational energy received from the motor of the electric power system to generate thrust for propelling the aircraft.

In some embodiments, the power electronics may include electrical components and a housing. The housing may be configured to mount the electrical components to the aircraft.

In some embodiments, the housing may include a base comprising a composite material of a first metallic material and ceramic fibers and a cover comprising a second metallic material. The base may be formed to include a cooling passageway that extends there through to transfer a flow of cooling fluid through the base to cool the electrical components mounted to the base. The cover may extend over the electrical components mounted to the base.

According to another aspect of the present disclosure, a propulsion system may include an electric power system and at least one propulsor. The propulsor may be coupled to the electric power system to generate thrust for propelling the aircraft.

In some embodiments, the electric power system may include a generator, power electronics, and a motor. The generator may be configured to generate electrical energy. The power electronics may be connected to the generator to receive the electrical energy from the generator and configured to convert the electrical energy for transferring the electrical energy between components of the electric power system. The motor may be configured to produce rotational energy in response to receiving electric energy.

In some embodiments, the power electronics may include electrical components and a housing. The housing may be configured to mount the electrical components to the aircraft.

In some embodiments, the housing may include a base comprising a composite material of a first metallic material and ceramic fibers and a cover comprising a second metallic material. The base may be formed to include a cooling passageway that extends there through to transfer a flow of cooling fluid through the base to cool the electrical components mounted to the base. The cover may extend over the electrical components mounted to the base.

In some embodiments, the base of the housing may include a base plate comprising the composite material and a heat shield comprising a third metallic material having a thermal resistance greater than the first metallic material. The base plate may be formed to define the cooling passageway. The heat shield may extend around an outer surface of the base plate to protect the base plate from high external temperatures.

In some embodiments, the base may include a base plate and at least one heat transfer pedestal. The base plate may be formed to define the cooling passageway. The heat transfer pedestal may be located in a cavity formed in the base plate that is in fluid communication with the cooling passageway.

In some embodiments, the heat transfer pedestal may include a plate and a plurality of fins. The plate may be flush with an inner surface of the base plate to close an opening to the cavity. The plurality of fins may extend from the plate into the cavity so as to be in fluid communication with the cooling fluid.

In some embodiments, the base of the housing may include a base plate comprising the composite material, a heat shield comprising a third metallic material having a thermal resistance greater than the first metallic material, and at least one heat exchanger pedestal. The base plate may be formed to define the cooling passageway. The heat shield may extend around an outer surface of the base plate to protect the base plate from high external temperatures. The heat transfer pedestal may be located in a cavity formed in the base plate that is in fluid communication with the cooling passageway.

In some embodiments, the heat transfer pedestal may include a plate and a plurality of fins. The plate may be flush with an inner surface of the base plate to close an opening to the cavity. The plurality of fins may extend from the plate into the cavity so as to be in fluid communication with the cooling fluid.

In some embodiments, the plurality of fins may comprise a fourth metallic material. The fourth metallic material may have a thermal resistance less than the first metallic material to transfer heat from the plate to the cooling fluid.

In some embodiments, the plate may include an embedded temperature sensor. The sensor may be configured to measure the temperature of the electrical components mounted to an outer surface of the plate.

In some embodiments, the base of the housing may include a base plate comprising the composite material and a heat shield comprising a third metallic material. The third metallic material may have a thermal resistance greater than the first metallic material. The heat shield may extend around an outer surface of the base plate.

In some embodiments, the base plate may be formed to define the cooling passageway and a plurality of fins comprising a fourth metallic material. The plurality of fins may extend into the cooling passageway. The fourth metallic material may have a thermal resistance less than the first metallic material.

In some embodiments, the plate may include an embedded temperature sensor configured to measure the temperature of the electrical components mounted to an outer surface of the plate.

In some embodiments, the system may further comprise a plurality of sensors. The plurality of sensors may each be embedded in the base plate.

In some embodiments, at least one sensor of the plurality of sensors may be a temperature sensor. The temperature sensor may be embedded in the base plate proximate to an inner surface of the base. The temperature sensor may be configured to measure the temperature of the electrical components mounted to the base.

In some embodiments, the plurality of sensors may be temperature sensors. The sensors may be embedded in the base proximate to an inner surface of the base plate. The sensors may be configured to measure the temperature of the electrical components mounted to the base.

In some embodiments, at least one sensor of the plurality of sensors may be a strain gauge. The strain gauge may be configured to measure the strain in the base.

In some embodiments, the plurality of sensors may be strain gauges. The strain gauges may be configured to measure the strain in the base.

According to another aspect of the present disclosure, a housing adapted to house the electrical components for an aircraft may be made by a process. The process may comprise the steps of ultrasonically welding layers of a first metallic material to begin forming a base plate of the housing, ultrasonically welding layers of the ceramic fibers between the layers of the first metallic material in different localized areas to increase stiffness in the base plate, repeating the steps of welding layers of the first metallic material and welding layers of the ceramic fibers until the base plate has a first predetermined thickness, machining a cooling passageway into the layers of the first metallic material of the base plate that are free of any ceramic fiber material therebetween after welding the layers of the first metallic material and welding the layers of the ceramic fibers to the first predetermined thickness, filling the cooling passageway with a water soluble material, and repeating the steps of welding layers of the first metallic material and welding layers of the ceramic fibers until the base plate has a second predetermined thickness that is greater than the first predetermined thickness.

In some embodiments, the process may further comprise machining a cavity into the layers of the first metallic material of the base plate that are free of any ceramic fiber material therebetween. The machining step may be after welding the layers of the first metallic material and welding the layers of the ceramic fibers to the second predetermined thickness. In some embodiments, the cavity may open into a part of the cooling passageway.

In some embodiments, the process may further comprise welding layers of the first metallic material separate from the base plate of the housing to form a plate with a predetermined thickness, welding layers of a second metallic material to the plate to a top surface of the layers of the first metallic material until the layers of the second metallic material has a predetermined height, machining the layers of the second metallic material to form a plurality of fins that extends away from the plate to create a heat exchanger pedestal, and arranging the heat exchanger pedestal in the cavity so that the plate is flush with an inner surface of the base plate and the plurality of fins extend into the cavity.

In some embodiments, the process may further comprise welding layers of a second metallic material to the layers of the first metallic material in localized areas that are separate from the localized areas with ceramic fibers. The welding step may be between the steps of welding layers of the first metallic material and welding layers of the ceramic fibers until the base plate has the first predetermined thickness. In some embodiments, the process may further comprise machining a plurality of grooves into the layers of the second metallic material to form a plurality of fins after machining the cooling passageway, filling the plurality of grooves with the water soluble material, and welding layers of the first metallic material over the plurality of fins to close the plurality of grooves and the cooling passageway.

In some embodiments, the process may further comprise embedding at least one sensor between layers of the first metallic material of the base plate. In some embodiments, the process may further comprise embedding a sensor between layers of the first metallic material of the plate. In some embodiments, the process may further comprise embedding a first set of sensors between layers of the first metallic material of the base plate.

These and other features of the present disclosure will become more apparent from the following description of the illustrative embodiments.

DETAILED DESCRIPTION OF THE DRAWINGS

Figure 1:
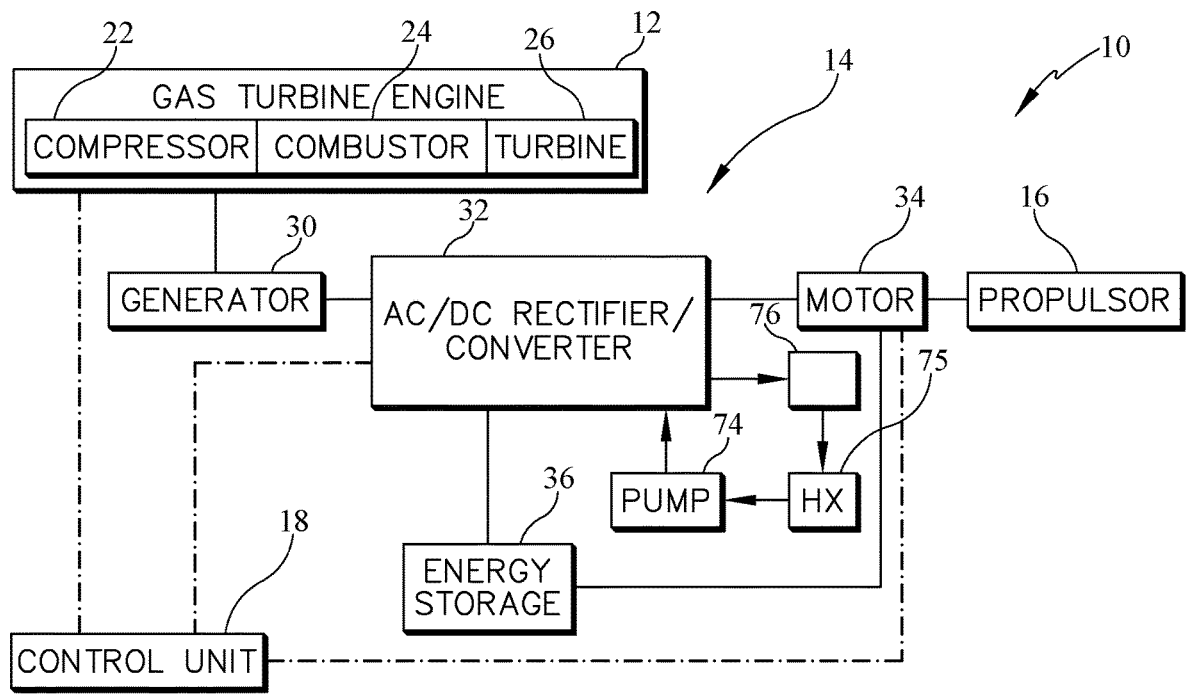
FIG. 1 is diagrammatic view of a hybrid turbo electric propulsion system adapted for use with an aircraft showing the system including a gas turbine engine, a generator coupled to the gas turbine engine to receive power generated by the gas turbine engine, a motor to drive a propulsor, and power electronics coupled to the generator and motor to convert power therebetween.

For the purposes of promoting an understanding of the principles of the disclosure, reference will now be made to a number of illustrative embodiments illustrated in the drawings and specific language will be used to describe the same.

A propulsion system 10 for use with an aircraft is shown in FIG. 1. The propulsion system includes a gas turbine engine 12, an electric power system 14, a propulsor 16, and a control unit 18 as shown in FIG. 1. The gas turbine engine 12 includes a compressor 22, a combustor 24 adapted to combine air received from the compressor 22 with fuel and ignite the fuel, and a turbine 26 configured to be rotated by the hot, high-pressure products of the combustion reaction in the combustor 24 to drive an output shaft 28 of the gas turbine engine 12. The electric power system 14 is coupled to the output shaft of the gas turbine engine 12 and configured to generate electrical energy from the work outputted by the gas turbine engine 12. The propulsor 16 is powered by the electric power system 14 to provide additional thrust for propelling the aircraft.

The electric power system 14 includes a generator 30, a power electronics 32, a motor 34, and an electrical storage device 36 as shown in FIG. 1. The generator 30 is coupled to the gas turbine engine 12 to generate electrical energy. The power electronics 32, also referred to as a rectifier/convertor 32, is connected to the generator 30 to receive the electrical energy and either store it in the electrical storage device 36 or use it to power the motor 34. The motor 34 is configured to produce rotational energy in response to receiving electric energy from the power electronics 32 and drive the propulsor 16.

In some embodiments, the power electronics 32 is also configured to convert the electrical energy for transferring the electrical energy between components of the electric power system 14. The propulsion systems 10 may rely on rectifiers or converters for converting alternating current (AC) from a generator into direct current (DC). The direct current may then be passed through high voltage cabling before being converted back into AC for use in a motor. Such power electronics may need to include thermal management to manage the high density heat loads, reinforcement to withstand shock loads caused by high-G maneuvers or hard landings, as well as shields against electromagnetic interference.

The power electronics 32 of the present disclosure includes a housing 38 integrated with thermal management features, electromagnetic interference shielding, and shock load reinforcement using ultrasonic additive manufacturing. The housing 38 includes a base 40, a cover 42, and vibration dampers 44 as shown in FIGS. 1-4. The base 40 is configured to mount and support the different components 39 of the power electronics 32. The cover 42 extends over the components 39 of the power electronics 32 and around an outer edge 62 of the base 40. The vibration dampers 44 extend between the base 40 and the aircraft to minimize the vibrations transferred to the base 40 and the cover 42.

To integrate the thermal management features, electromagnetic interference shielding, and shock load reinforcement into the housing 38, ultrasonic additive manufacture (UAM) is used to form the different components of the housing 38. UAM is a low temperature solid state joining technique that uses ultrasonic oscillation, or scrubbing, of thin layers/films to produce a metallurgical bond therebetween. Different materials are ultrasonically welded together to provide a composite material with improved strength and thermal benefits in the different components of the housing 38.

Figure 8:
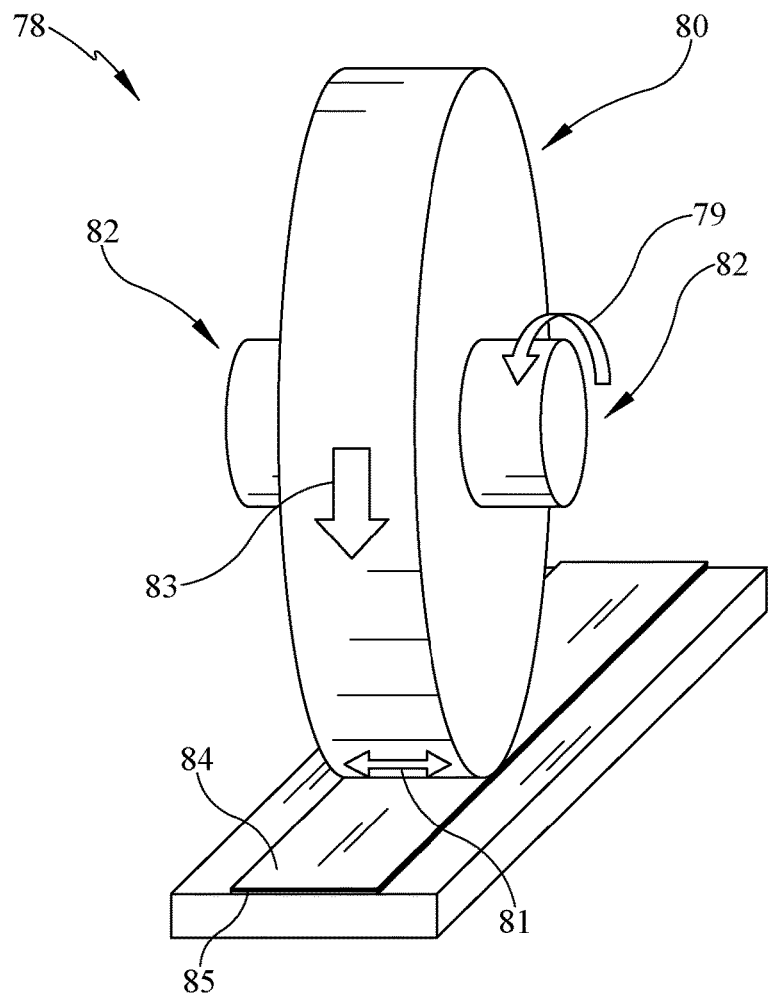
FIG. 8 is a perspective view of an ultrasonic additive manufacturing tool for an ultrasonic welding process used to form the housing of the converter.

The ultrasonic welding uses an ultrasonic additive manufacturing tool 78 that includes a sonotrode 80 and transducers 82 as shown in FIG. 8. The transducers 82 are coupled to the sonotrode 80 and configured to produce ultrasonic vibrations as indicated by the arrows 81. Simultaneously, the sonotrode 80 rotates as indicated by arrows 79 and provides a downward force as indicated by arrow 83 to ultrasonically weld two strips 84, 85 of material together.

Figure 9:
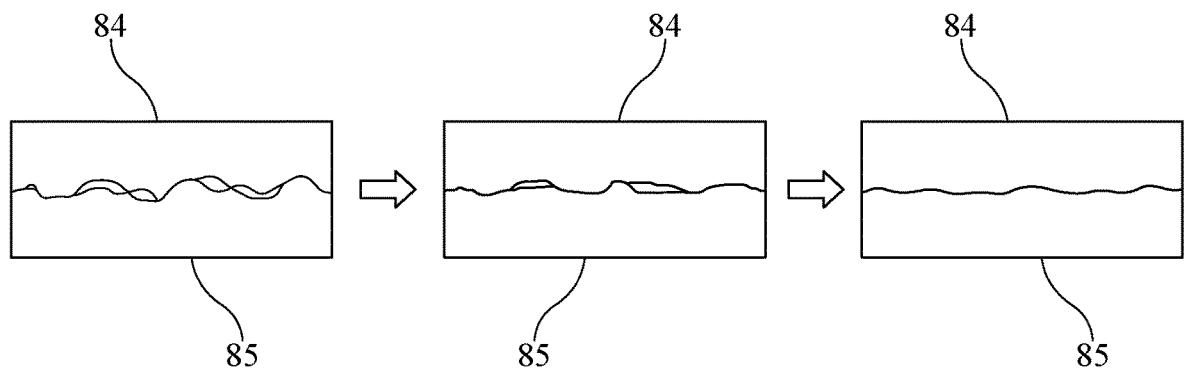
FIG. 9 is a diagrammatic view of layers being ultrasonically welded together using the ultrasonic additive manufacturing tool of FIG. 8.

The ultrasonic welding process forms a bond between the two layers 84, 85 as shown in FIG. 9. In some embodiments, the different layers 84, 85 may be different materials, with different material properties. The ultrasonic welding allows different materials with different properties to be bonded together.

The base 40 comprises a composite material of a first metallic material and ceramic fibers created using the ultrasonic welding process. The cover 42 comprises a second metallic material. In some embodiments, the first and second metallic materials are the same. In the illustrative embodiment, the first and second metallic materials are different.

Figure 2:
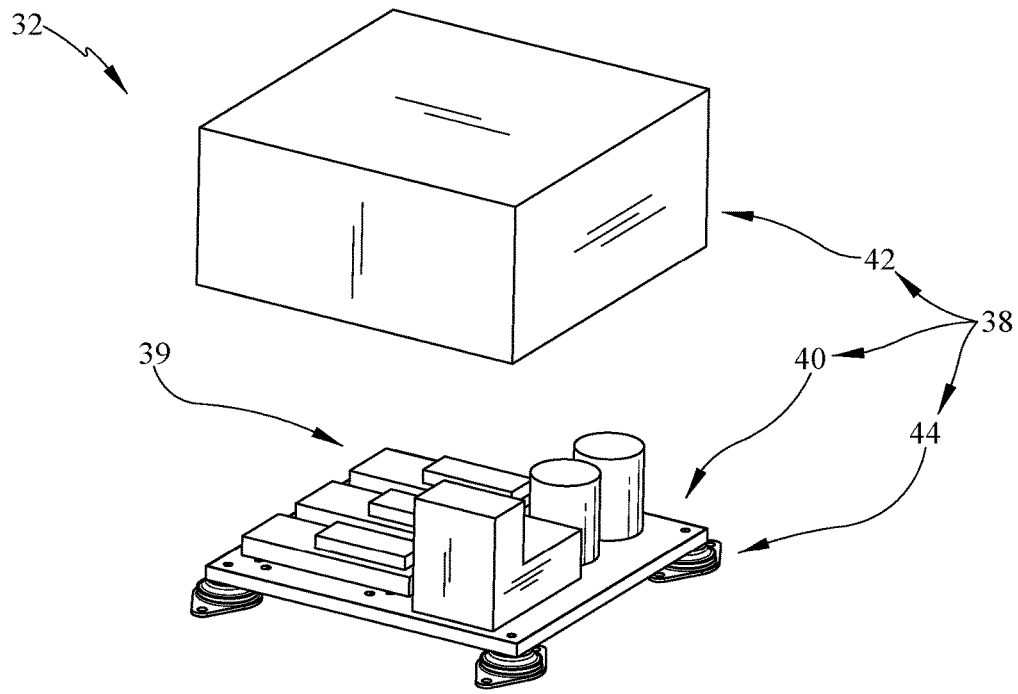
FIG. 2 is an exploded view of the converter included in the propulsion system of FIG. 1 showing the power electronics includes electrical components and a housing for the electrical components that is integrated with thermal management features, electromagnetic interference shielding, and shock load reinforcement using ultrasonic additive manufacturing to protect the electrical components.
Figure 3:
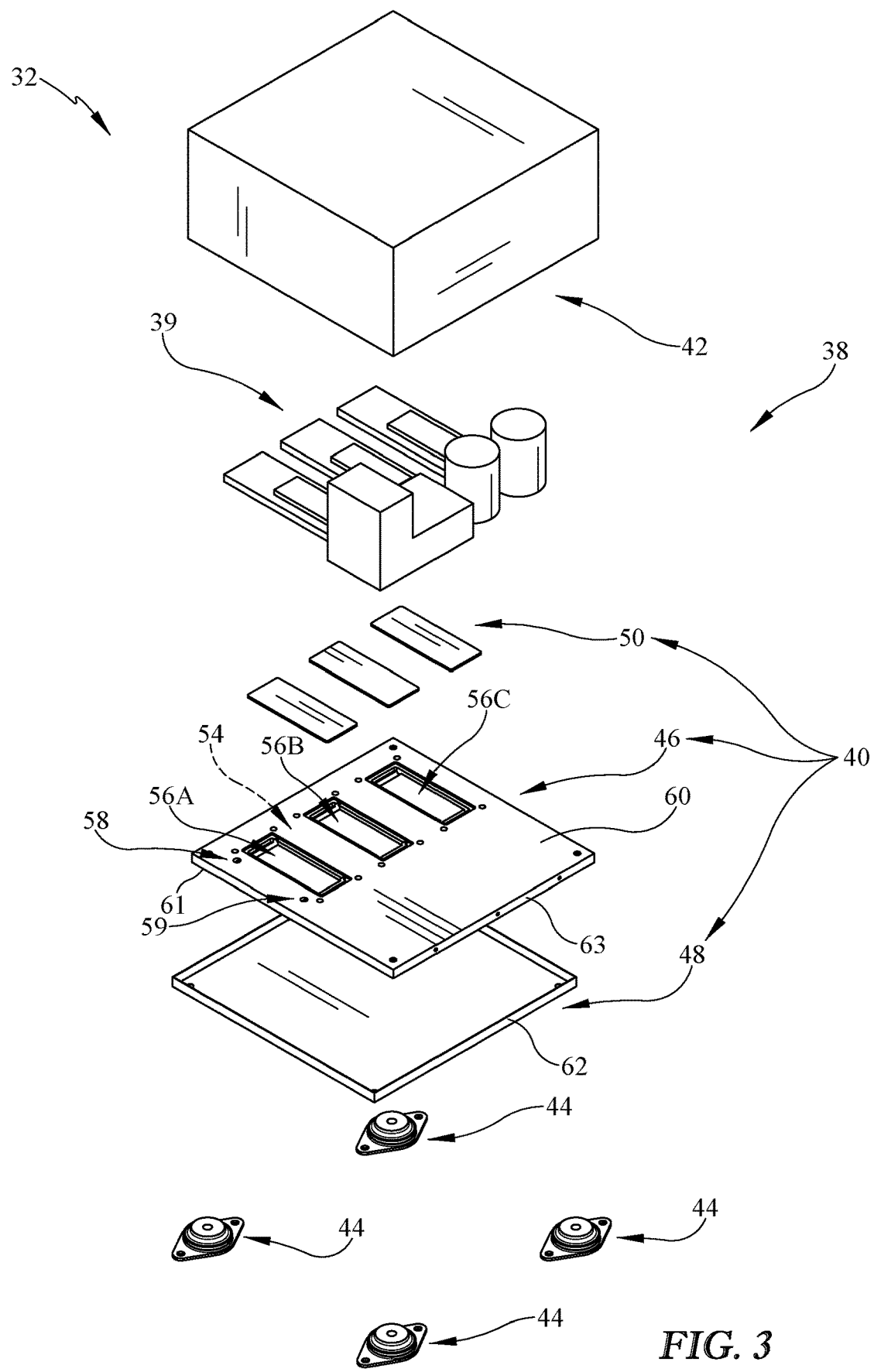
FIG. 3 is an exploded view of the converter of FIG. 2 showing the power electronics includes a base to which the electrical components are to be mounted, a cover that extends over the electrical components mounted to the base, and vibration dampers to be coupled to the base to minimize the vibrations transferred the base and the cover, and further showing the base has a base plate, a heat shield configured to extend over the base plate to protect it from high external temperatures, and heat exchanger pedestals configured to transfer heat from the electrical components to cooling fluid flowing through a cooling passageway formed in the base plate.
Figure 4:
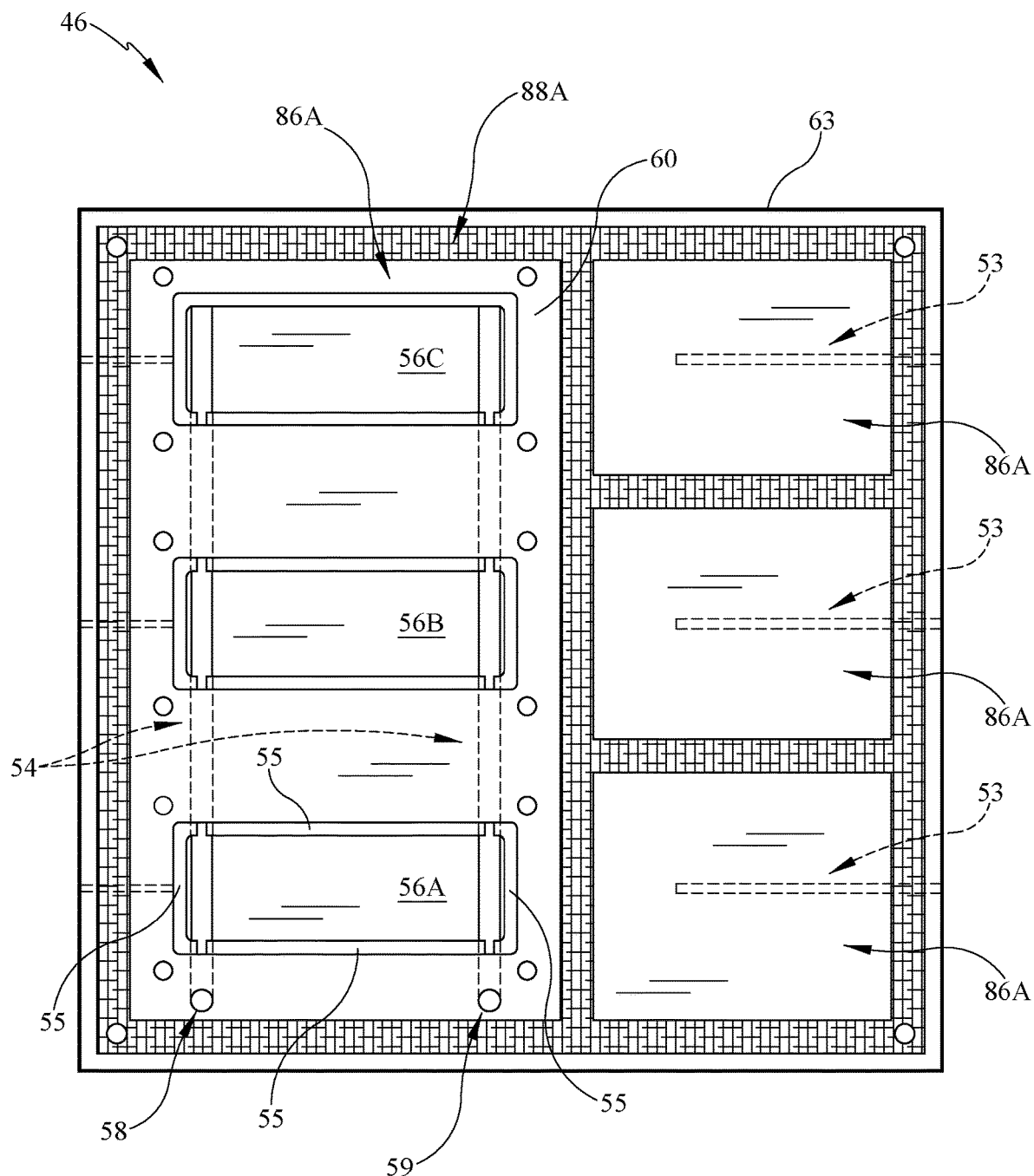
FIG. 4 is a top view of the base plate included in the converter of FIG. 3 showing the base plate comprises a composite material of a first metallic material and ceramic fibers formed using ultrasonic additive manufacturing to strengthen the base plate against shock loads to the converter.

The base 40 includes a base plate 46, a heat shield 48, and heat exchanger pedestals 50 as shown in FIGS. 2-7. The base plate 46 comprises the composite material of the first metallic material and ceramic fibers, which are integrated together to improve the stiffness of the base plate 46 as shown in FIG. 4. The first metallic material forms the areas 86A, while the ceramic fibers are located in the localized areas 88A around the areas 86A of the first metallic material.

Ultrasonic welding of the base plate 46 also forms an integral cooling passageway 54 that extends through the base plate 46. The heat shield 48 comprises a third metallic material having a thermal resistance greater than the first metallic material, which protects the base 40 against exposure to high temperatures or fire. The heat exchanger pedestals 50 comprise the first metallic material and a fourth metallic material. The fourth metallic material has a thermal resistance less than the first metallic material to improve the heat transfer between the components 39 mounted to the base 40 and the cooling fluid flowing through the cooling passageway 54 of the base plate 46.

In the illustrative embodiment, the first metallic material is aluminum. The third metallic material is nickel and the fourth metallic material is copper. In other embodiments, the first, second, third, and fourth metallic materials may be another suitable metallic material.

For forming the base plate 46, layers of the first metallic material strips 86 and layers of the ceramic fiber strips 88 are ultrasonically welded together. The ceramic fiber layers 88 have a high tensile strength and temperature resistance, which increases the stiffness of the base plate 46 included in the base 40 of the housing 38.

The layers of the first metallic material 86 are aluminum in the illustrative embodiment. The ceramic fiber layers 88 are distributed between layers of the aluminum 86 in localized areas 88A of the base plate 46 to provide the increased stiffness, which allows the areas of the base plate 46 with the heat exchanger pedestals 50 to be non-load bearing.

In the illustrative embodiment, the ceramic fibers may be Nextel™. In other embodiments, the ceramic fibers may be another suitable ceramic fiber/fabric material.

Figure 7:
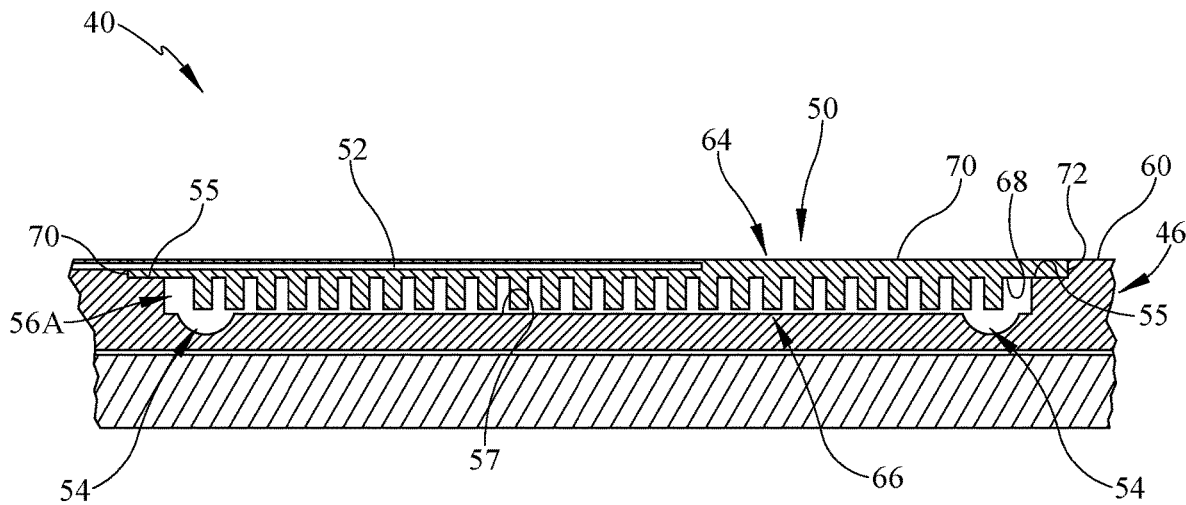
FIG. 7 is a cross-section view of the assembled base of FIG. 6 taken along line 7-7 showing the plurality of fins in fluid communication with the cooling passageway in the base plate to transfer heat dissipated by the electric components to the cooling fluid flowing through the passageway.

The base plate 46 is integrally formed with the cooling passageway 54 and cavities 56A, 56B, 56C as shown in FIGS. 3, 4, and 7. During the process of forming the base plate 46, the cooling passageway 54 is machined into the first metallic material only sections of the base plate 46 and filled with a water-soluble material. The steps of ultrasonically welding the aluminum layers 86 are repeated over the machined cooling passageway 54 so that the cooling passageway 54 is integrally formed in the base plate 46. The water-soluble material is rinsed out once all the additional layers are added. The cavities 56A, 56B, 56C then are machined into an inner surface 60 of the base plate 46 so that the cavities 56A, 56B, 56C are in fluid communication with the cooling passageway 54.

In the illustrative embodiment, three cavities 56A, 56B, 56C are machined into the inner surface 60 of the base plate 46. In other embodiments, a different number of cavities 56A, 56B, 56C may be machined in the base plate 46. In some embodiments, only one cavity 56A, 56B, 56C may be machined into the base plate 46. In other embodiments, more than one cavity 56A, 56B, 56C may be machined into the base plate 46.

The heat shield 48 is arranged to extend around an outer surface 61 and an outer edge 63 of the base plate 46 as shown in FIG. 3. The third metallic material of the heat shield 48 is nickel in the illustrative embodiment as it protects the base plate 46 from high temperatures. In other embodiments, third metallic material layers may be ultrasonically welded to the outer surface 61 and/or the outer edge 63 of the base plate 46 to form the heat shield 48. In other embodiments, the heat shield 48 may be formed by electroless (i.e. "e-nickel") plating or nickel plating.

In the illustrative embodiment, the heat shield 48 forms the outer edge 62 of the base 40. In other embodiments, the outer edge 62 may be the outer edge 63 of the base plate 46 and the cover 42 may be coupled to the outer edge 63 of the base plate 46.

Figure 5:
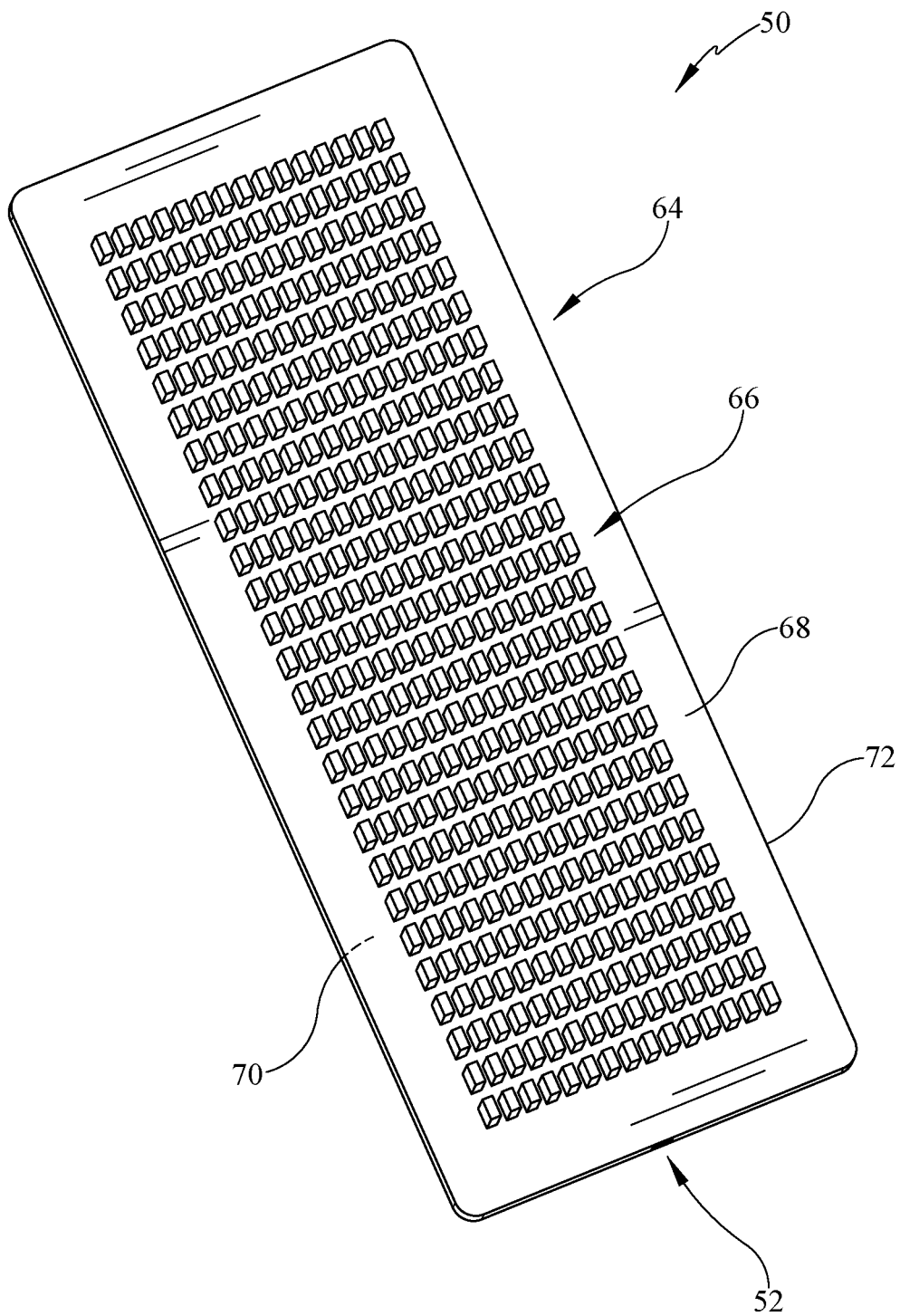
FIG. 5 is a perspective view of one of the heat exchanger pedestals included in the converter of FIG. 3 showing the pedestal comprises a plate and a plurality of fins that extend from the plate.
Figure 6:
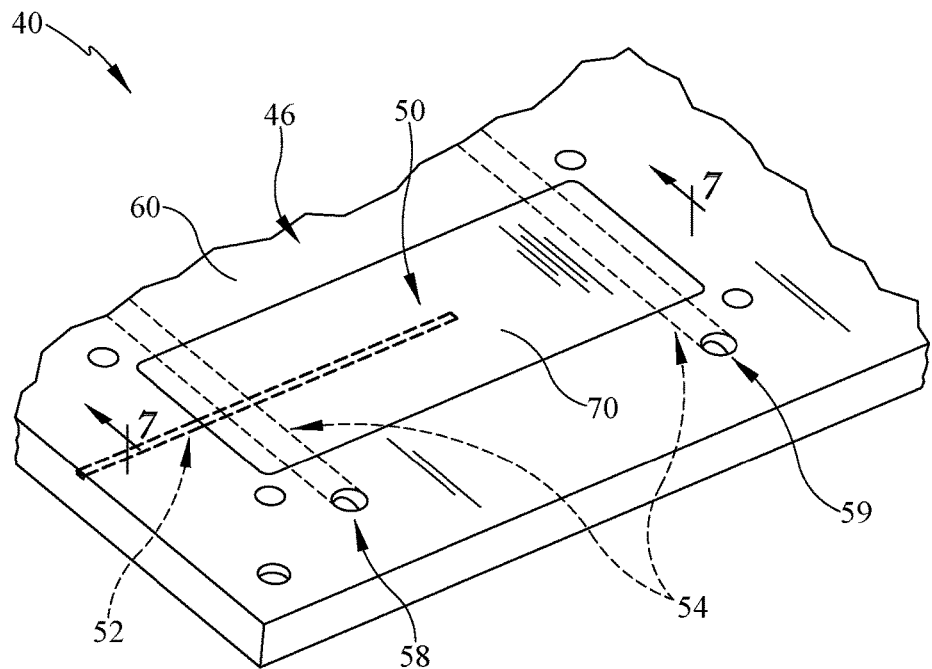
FIG. 6 is a perspective detail view of one of the pedestals assembled with the base plate of FIG. 4 showing the pedestal further includes embedded sensors in the plate that measure the temperature near a surface of the base.

Each heat exchanger pedestal 50 includes a plate 64 and a plurality of fins 66 as shown in FIGS. 5-7. The plate 64 comprises the first metallic material, while the plurality of fins 66 comprise the fourth metallic material in the illustrative embodiment.

The layers of the fourth metallic material 90 are ultrasonically welded to the plate 64. The fourth metallic material portion of the pedestal 50 is then machined to form the plurality of fins 66 so that the plurality of fins 66 extend from a first surface 68 of the plate 64.

The fourth metallic material is copper in the illustrative embodiment, as copper has a better thermal conductivity to transfer heat to the cooling fluid. In this way, the fins 66 have a better thermal conductivity than the plate 64, while the aluminum material that forms the plate 64 has a lesser density than copper. This reduces the weight of the heat exchanger pedestals 50. The pedestals 50 therefore help increase the thermal heat transfer, while also reducing the weight of the power electronics 32.

Each heat exchanger pedestal 50 is arranged in a corresponding cavity 56A, 56B, 56C so that a second surface 70 of the plate 64 is flush with the inner surface 60 of the base plate 46 and the plurality of fins 66 extend into the corresponding cavity 56A, 56B, 56C in fluid communication with the cooling fluid. The plate 64 has outer edges 72 that engages a shoulder 55 of the cavity 56A, 56B, 56C so that the fins 66 are suspended about a bottom surface 57 of the cavity 56A, 56B, 56C. The plate 64 closes an opening to the cavity 56A, 56B, 56C so that no cooling fluid flows out of the cooling passageway 54.

The housing 38 is also integrated with sensors 52, 53 as shown in FIGS. 4-7. In the illustrative embodiment, the plate 64 of each pedestal 50 is embedded with a sensor 52 between ultrasonically welded layers of the aluminum. The sensors 52 are configured to measure the temperature of the components 39 mounted to the base plate 46 above the second surface 70 of each pedestal 50 in the illustrative embodiment.

The sensors 53 are embedded between layers of the first metallic material of the base plate 46 in the areas 86A. The sensors 53 are embedded near the inner surface 60 of the base plate 46 in the illustrative embodiment. In other embodiments, the sensors 53 may be embedded in other areas of the base plate 46.

The sensors 53 may be configured to measure the temperature of the components 39 mounted to the inner surface 60 of the base plate 46. In other embodiments, the sensors 53 may be strain gauges configured to measure the strain in the base plate 46 over the course of the flight in the illustrative embodiment. In other embodiments, the sensors 53 may be optical fibres and fibre Bragg gradient may be used to measure the strain in the base plate 46.

In some embodiments, either of the sensors 52, 53 may be accelerometers that are configured to measure the acceleration of the power electronics 32. In other embodiments, either of the sensors 52, 53 may be a force sensor configured to measure force exerted on the power electronics 32. In some embodiments, some of the sensors 52, 53 are temperature sensors, while the other sensors may be accelerometers and/or force sensors.

In the illustrative embodiments, the control unit 18 is connected to the sensors 52, 53 to control the thermal management of the power electronics 32. The control unit 18 may also monitor the temperature and the strain within the housing 38 using the sensors 52, 53. The control unit 18 may control the flow rate of cooling fluid through the cooling passageway 54 depending on the temperature measured by the sensors 52, 53.

Turning again to the electric power system 14, the components 39 of the power electronics 32 include semiconductors, control boards, resistors, EMI filter inductors, and an inductor as suggested in FIG. 2. When in use, the components of the power electronics 32 produce a high heat load.

To dissipate the high head load of the power electronics 32 some systems includes a cold plate in the power electronics 32 to transfer the heat of the components 39. The additional cold plate adds weight to the power electronics 32 and may not be effective in contacting each of the component 39 in the power electronics 32. The housing 38 of the power electronics 32 of the present disclosure, includes the integrated cooling passageway 54 to transfer cooling fluid through the housing 38 to absorb heat dissipated by the components 39 mounted directly to the base plate 46.

The system 10 further includes a thermal management system 20 as shown in FIG. 1. The thermal management system 20 is fluid communication with the cooling passageway 54 of the base plate 46.

The thermal management system 20 includes a pump 74, a ambient heat exchanger 75, and a reservoir 76 as shown in FIG. 1. The pump 41 is coupled to an inlet 58 of the cooling passageway 54 to move a flow of cooling fluid through the cooling passageway 54 to transfer heat from the power electronics 32 to the cooling fluid. The reservoir 76 is coupled to an outlet 59 of the cooling passageway 54 to receive the heated cooling fluid. The ambient heat exchanger or condenser 75 is in fluid communication with the reservoir 76 to receive the cooling fluid. The condenser 75 is also in thermal communication with the atmosphere to transfer the heat from the cooling fluid to the surrounding atmospheric air. The cooled cooing fluid is then pumped back into the housing 38.

In the illustrative embodiment, the cavities 56A, 56B, 56C formed in the base plate 46 includes a first cavity 56A, a second cavity 56B, and a third cavity 56C as shown in FIGS. 3, 4, and 7. The inlet and outlet 58, 59 of the cooling passageway 54 are in fluid communication with the first cavity 56A. The cooling fluid is pumped through the inlet 58 into the first cavity 56A. Some of the fluid flows across the fins 66 of the pedestal 50 arranged in the first cavity 56A to the outlet 59, while the rest of the fluid continues to flow through the cooling passageway 54 to the second cavity 56B.

As the fluid enters the second cavity 56B, some of the fluid flows across the fins 66 of the pedestal 50 arranged in the second cavity 56B and through the cooling passageway 54 back to the first cavity 56A. The rest of the cooling fluid continues to flow through the cooling passageway 54 to the third cavity 56C.

The cooling fluid supplied to the third cavity 56C flows across the fins 66 of the pedestal 50 arranged in the third cavity 56C and through the cooling passageway 54 to the outlet 59. In other embodiments, the cooling passageway 54 may have another suitable arrangement to transfer the cooling fluid across the fins 66 of the pedestals 50.

In some embodiments, the cover 42 may include electromagnetic shielding material. The material may be ultrasonically welded with the second metallic material, titanium in the illustrative embodiment, to protect the components 39 from electromagnetic interference.

Figure 10:
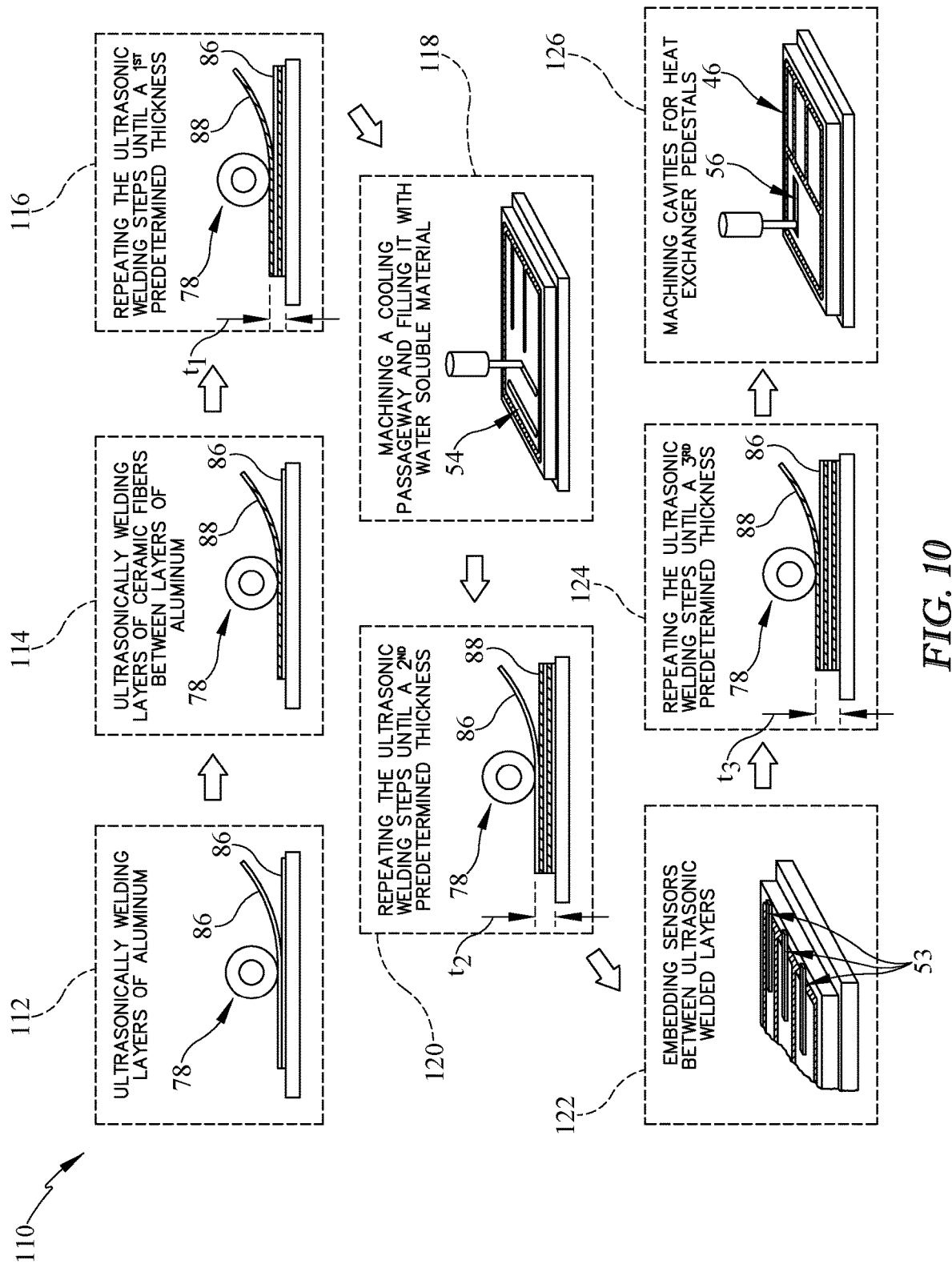
FIG. 10 is a diagrammatic view of the ultrasonic welding process for forming the base plate of the housing.
Figure 11:
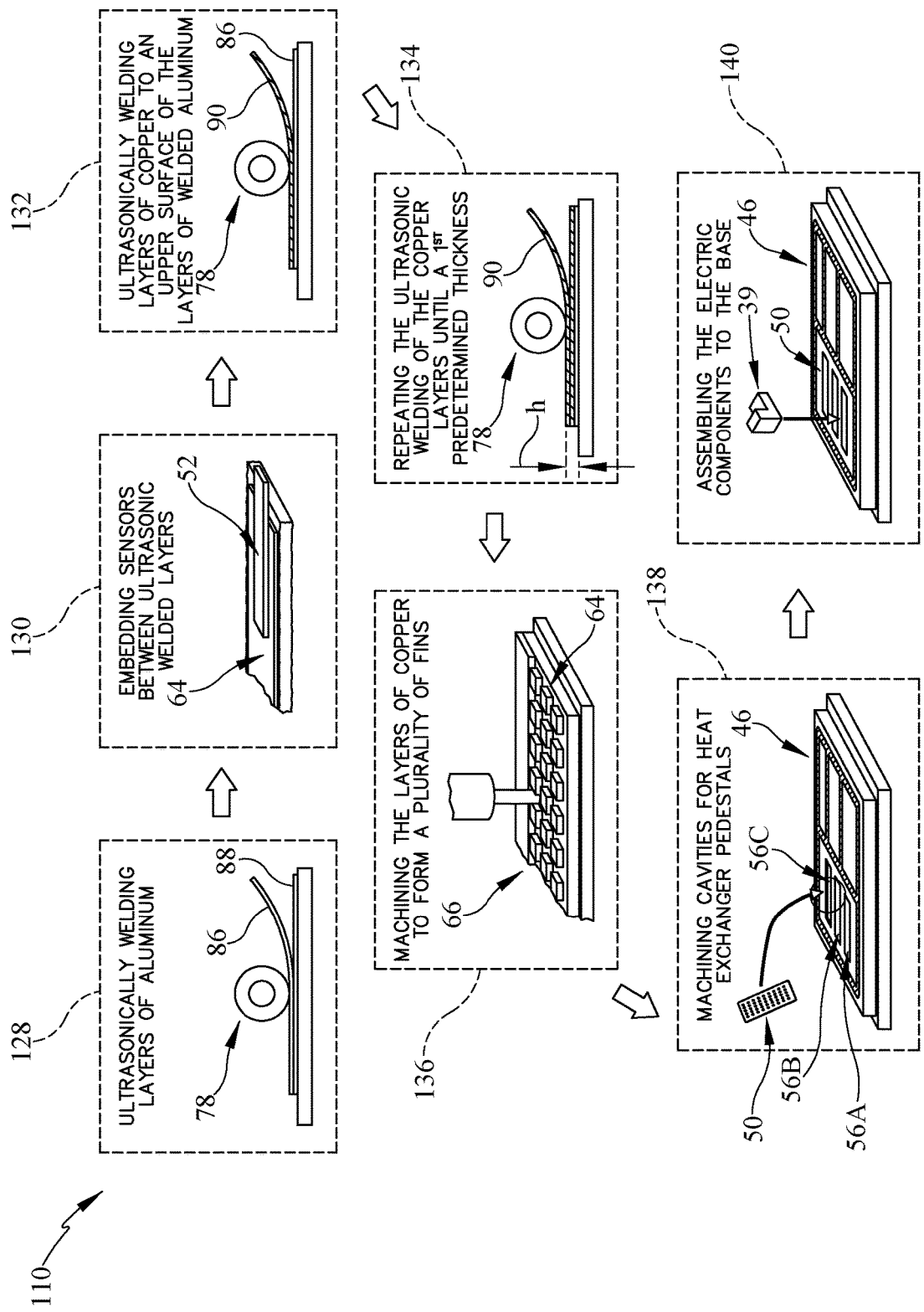
FIG. 11 is a diagrammatic view of the ultrasonic welding process for forming the heat exchanger pedestals and assembling the components of the power electronics together.

The housing 38 may be made by a process 110 as suggested in FIGS. 10 and 11. The process 110 may comprise several different steps. The process 110 uses ultrasonic welding to form the different components of the housing 38 before the components are assembled together.

The process 110 may begin by forming the base plate 46 of the housing 38 as shown in FIG. 10. Layers of the first metallic material 86 are ultrasonically welded to begin forming the base plate 46 of the housing 38 as indicated by box 112. In the illustrative embodiment, the first metallic material is layers of the aluminum. In other embodiments, another suitable metallic material may be used.

Strips or pieces of the aluminum 86 are laid side-by-side to form the dimensions of the base plate 46 in the illustrative embodiment. To build up the thickness of the base plate 46, additional layers of the aluminum 86 are ultrasonically welded to the base strips of the aluminum 86. The layers of the aluminum strips 86 are staggered from the below layer of strips 86 so that there are no gaps therebetween.

Additionally, layers of the ceramic fibers 88 are ultrasonically welded between the layers of the first metallic material 86 as indicted by box 114. The layers of the ceramic fibers 88 are ultrasonically welded in different localized areas to increase stiffness in the base 40 as suggested in FIG. 4. The composite material of the first metallic material and ceramic fibers is therefore only forms portions of the base plate 46 in the illustrative embodiment. The layers of the ceramic fiber strips 88 may be included with the base layer of the first metallic material 86 and in subsequent layers when building the thickness of the base plate 46. The localized areas of the ceramic fibers 88 are distributed to increase the stiffness of the base plate 46, while other areas only include the first metallic material layers 86.

The steps of ultrasonically welding layers of the first metallic material 86 and welding layers of the ceramic fibers 88 are repeated until the base plate 46 has a first predetermined first thickness $t_1$ as indicated by box 116. At the predetermined thickness $t_1$, the process 110 includes machining the cooling passageway 54 into the base plate 46 as indicated by box 118. The cooling passageway 54 is machined into ceramic fiber free areas (i.e. aluminum only) in the illustrative embodiment. The cooling passageway 54 is then filled with water-soluble material.

Once the cooling passageway 54 is machined and filed with water soluble material, the steps of welding layers of the first metallic material 86 and layers of the ceramic fibers 88 are repeated until the base plate 46 has a predetermined second thickness $t_2$ as indicated by box 120. The second thickness $t_2$ is greater than the first thickness $t_1$. At this second thickness $t_2$, the sensors 53 may be embedded into the base plate 46 as indicated by box 122.

The sensors 53 are arranged in the desired areas 86A, and then additional layers of the first metallic material 86 and layers of the ceramic fibers 88 are welded on top thereof to build up the remaining thickness of the base plate 46 as indicated by box 124. Once the base plate 46 has a predetermined third thickness $t_3$, the cavities 56A, 56B, 56C are machined into the inner surface 60 of the base plate 46 as indicated by box 126. The third thickness $t_3$ is greater than the second thickness $t_2$. The cavities 56A, 56B, 56C are machined into the base plate 46 so as to be in communication with the cooling passageway 54.

The process may continue with forming the heat exchanger pedestals 50 as shown in FIG. 11. Layers of the first metallic material 86 are ultrasonically welded separate from the base plate 46 to begin forming the plate 64 as indicate by box 128. In the illustrative embodiment, the first metallic material is aluminum to form the plate 64. In other embodiments, the first metallic material may be another suitable material.

Strips or pieces of the aluminum 86 are laid side-by-side to form the dimensions of the plate 64. To build up the thickness of the plate 64, the layers of the aluminum 86 are ultrasonically welded to the base strips of the aluminum 86. The layers of the aluminum strips 86 are staggered from the below layer of strips 86 so that there are no gaps therebetween.

In the illustrative embodiment, the process of forming the pedestals 50 includes embedding sensors 52 between layers of the first metallic material 86 as indicated by box 130. Once the plate 64 has a predetermined thickness, layers of the fourth metallic material 90 are ultrasonically welded on top of the layers of the aluminum 86 as indicated by box 132. In the illustrative embodiment, the fourth metallic material is copper. In other embodiments, the fourth metallic material may be another suitable material with a high thermal conductivity.

This step is repeated until the copper layers 90 are at a predetermined height h as indicated by box 134. The copper material is then machined away to form the fins 66 as indicated by box 136. The machining of the copper material forms the fins 66 with a predetermined pattern like as shown in FIG. 5.

The finished pedestals 50 may then be arranged in the corresponding cavity 56A, 56B, 56C formed in the base plate 46 as indicated by box 138 in FIG. 11. The pedestals 50 may then be secured to the shoulders 55 of the corresponding cavity 56A, 56B, 56C to seal off the cavity 56A, 56B, 56C and the cooling passageway 54. The pedestals 50 may be secured using a fastener. In other embodiments, the pedestals 50 may be welded to the base plate 46 in the cavity 56A, 56B, 56C. With the base 40 assembled, the components 39 may be assembled onto the inner surface 60 of the base plate 46 as indicated by box 140.

With the components 39 assembled onto the base plate 46, the heat shield 48 may be assembled onto the base plate 46 to cover the outer surface 61. In other embodiments, the second metallic material of the heat shield 48 may be ultrasonically welded to the base plate 46. The cover 42 is then arranged over the components 39 and the vibration dampers 44 are coupled to the bottom of the base 40.

Figure 12:
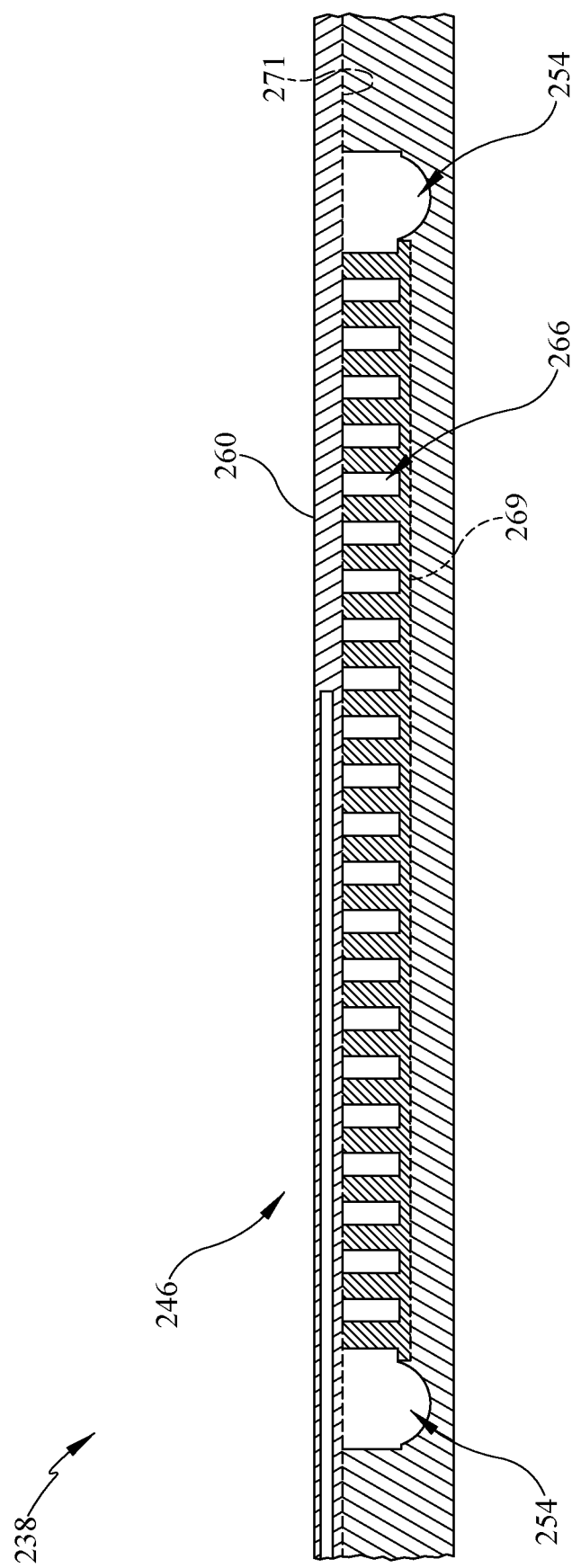
FIG. 12 is a cross-section view of another embodiment of a housing for the power electronics of FIG. 2 showing the housing includes a base plate comprising a first metallic material integrally formed with a cooling passageway and a plurality of fins comprising a different metallic material that extend into the cooling passageway.
Figure 13:
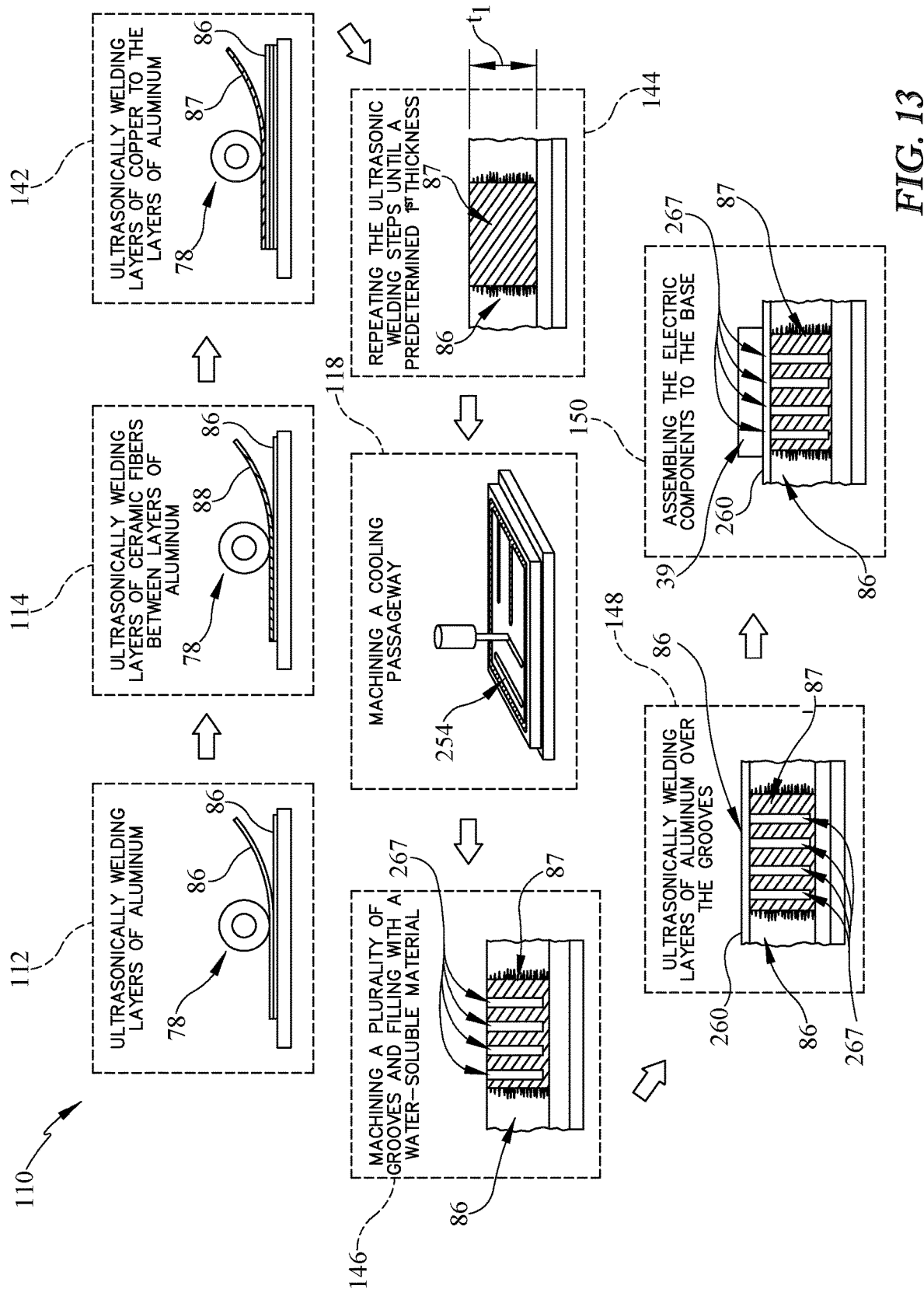
FIG. 13 is a diagrammatic view of another ultrasonic welding process for forming the base plate of the housing of FIG. 12.

Another embodiment of a housing 238 for the power electronics 32 in accordance with the present disclosure is shown in FIGS. 12-13. The housing 238 is substantially similar to the housing 38 shown in FIGS. 2-7 and described herein. Accordingly, similar reference numbers in the 200 series indicate features that are common between the housing 238 and the housing 38. The description of the housing 38 is incorporated by reference to apply to the housing 238, except in instances when it conflicts with the specific description and the drawings of the housing 238.

The housing 238 includes a base plate 246 that comprises a composite material of the first metallic material and ceramic fibers integrated together to improve the stiffness of the base plate 246. Ultrasonic welding of the base plate 246 also forms an integral cooling passageway 254 that extends through the base plate 246.

In the illustrative embodiment, the cooling passageway 254 is formed to include a plurality of fins 266 that extend into the cooling passageway 254 as shown in FIGS. 12 and 13. The fins 266 may be located in areas like the arrangement of the cavities 56A, 56B, 56C in the embodiments of FIGS. 2-7.

In the embodiment of FIGS. 2-7, the separate heat exchanger pedestals 50 are fastened to the base plate 46 to seal the cooling passageway 54. Rather than having separate heat exchanger pedestals 50, which may need additional seals, the base plate 246 has integrally formed fins 266 by ultrasonically welding layers of the fourth metallic material strips 87 to form the portion of the base plate 246 and machining a plurality of grooves 267 to form the fins 266.

The base plate 246 may be made using the process 110, but instead of forming separate heat exchanger pedestals 50, the process 110 includes different steps for forming the base plate 246 as shown in FIG. 13.

Similar to forming the base plate 46, layers of the first metallic material 86 are ultrasonically welded to begin forming the base plate 246 as indicated by box 112. Strips or pieces of the aluminum 86 are laid side-by-side to form the dimensions of the base plate 246. To build up the thickness of the base plate 246, additional layers of the aluminum 86 are ultrasonically welded to the base strips of the aluminum 86. The layers of the first metallic material strips 86 are staggered from the below layer of strips 86 so that there are no gaps therebetween.

Additionally, layers of the ceramic fibers 88 are ultrasonically welded between the layers of the first metallic material 86 as indicted by box 114. The layers of the ceramic fibers 88 are ultrasonically welded in different localized areas.

Between steps of welding layers of the first metallic material 86 or layers of the ceramic fibers 88, layers of the fourth metallic material 87 are ultrasonically welded to the layers of the first metallic material 86 as indicated by box 142. The layers of the fourth metallic material strips 87 are welded in a portion of the base plate 246 that will later include the cooling passageway 254. The layers of the fourth metallic material 87 are ultrasonically welded to the base layers of the first metallic material 86 suggested by a bond line 269 as shown in FIG. 12.

The steps of welding layers of the first metallic material 86 and layers of the fourth metallic material 87 are repeated until the base plate 246 has a predetermined first thickness $t_1$ as indicated by box 144. At the predetermined thickness $t_1$, the process 110 includes machining the cooling passageway 254 into the base plate 246 as indicated by box 118 and machining a plurality of grooves 267 into the base plate 246 as indicated by box 146.

The cooling passageway 254 is machined into ceramic fiber free areas (i.e. aluminum only) in the illustrative embodiment, while the grooves 267 are machined into the fourth metallic material areas. The cooling passageway 254 and the grooves 267 are then filled with water-soluble material.

Once the cooling passageway 254 and the grooves 267 are filled with water-soluble material, layers of the first metallic material 86 are welded over the cooling passageway 254 and the grooves 267 to close off the cooling passageway 254 and the grooves 267 as indicated by box 148. The layers of the first metallic material 86 are ultrasonically welded to the machined fins 266 as suggested by a bond line 271 as shown in FIG. 12.

This step is repeated until the base plate 246 as the desired thickness and then the water-soluble material is rinsed out to create the fins 266 as indicated by box 150. The components 39 may be coupled to the inner surface 260 of the base plate 246 over the areas of the base plate 246 with the fins 266.

Propulsions systems may use electric power systems to drive a propulsor or fan prop 16. Such propulsions systems may be a series hybrid propulsion system in which a gas turbine engine 12 drives a generator 30, which generates electric energy that is stored in an energy storage device 36. At least one motor 34 uses the electrical energy on the storage device 36 to drive the propulsor 16.

The propulsions system may be a turbo electric propulsion system, which does not use an energy storage device 36 in some embodiments. In other embodiments, the propulsion system may be a parallel hybrid propulsion system that uses motor/generators 30 that receive electric energy from a storage device 36 to drive the gas turbine engine 12 and/or the propulsor 16 and generate electric energy when needed. In other embodiments, the propulsion system may be all electric and does not use a generator 30 or a gas turbine engine 12, but rather uses all the electric energy stored in the energy storage device 36.

Propulsion systems rely on rectifiers/convertors 32 for converting alternating current (AC) from the electromagnetic generator into direct current (DC), which is then passed through high voltage cabling before being converted back into AC for use in the electric motor 34. These rectifiers/convertors 32 are examples of power electronics 32. These systems 32 may have different functional demands.

For example, the power electronics 32 may have thermal management requirements due to the high power dissipated from the components 39 of the system 32. The power electronics 32 may also need electromagnetic interference shielding and shock load management due to the high-G maneuvers or hard landing of the aircraft. Reducing the weight of the power electronics 32 may also be beneficial.

The power electronics 32 may also need environmental protection, including corrosion, as well as protection against high temperatures such as a fire. The power electronics 32 may also need to be electrically conductive (at least at contact points with airframe) to avoid buildup of static charge.

Ultrasonic Additive Manufacturing (UAM) is a low temperature solid state joining technique. It is a unique additive technique that uses ultrasonic oscillation (or scrubbing) of thin films to produce a metallurgical bond at very low temperatures. In the illustrative embodiment, UAM may offer a number of unique advantages to the design/manufacture of the power electronics enclosure 38, (e.g. the invertor/convertor for hybrid propulsion systems).

For example, currently power electronic systems may use a separate cold plate for cooling the electrical components. This cold plate adds weight to the system and creates a potential for condensation inside the enclosure 38. The housing 38 of the present disclosure includes an integral cooling passageway 54 formed in the base plate 46 of the housing 38 using UAM.

Current system use separate EMI shielding plates, which adds additional weight to the system. However, the housing 38 of the present disclosure includes integrated thin layers of other materials, such as copper, in the housing 38, which shield from EMI.

The composite material of metallic material and ceramic fibers in the base plate 46, 246 provides selective shock load reinforcement to the housing 38, 238. In the illustrative embodiment, the metallic material is aluminum. In other embodiments, the metallic material may be another suitable metallic material. The ultrasonic welding allows the high strength ceramic fibers to be embedded in localized areas of the base plate 46, 246.

Using UAM also allows material to only be added where it may be needed. The selective reinforcement of the base plate 46, 246 reduces the weight of the base plate 46, 246, while also improving the stiffness. Integrating the cooling passageway 54, 254 into the base plate 46, 246 also allows the separate cold plate to be eliminated, which further reduces the weight.

Cladding may be added to improve the environmental protection. The heat shield 48 is configured to reduce the potential for fire and protect the components 39 from high temperature exposure. Electrically conductive material may also be ultrasonically welded in localized areas to avoid buildup of static charge.

UAM is also used to embed/integrate fibre optics for strain measurement (shock loads), thermocouples for thermal management, or other measurement devices into the housing 38. The sensors 52, 53 therefore provide the ability for real time health monitoring of the unit.

In the illustrative embodiment, integration of power electronics with the generator may cause the power electronics to be exposed to vibration/shock loads. Active strain and/or displacement measurements using the sensors 53 may be beneficial.

In some embodiments, metallic foams may be used to integrate cooling fluids for thermal management and explosion resistance. Titanium with composite structures, the titanium may have a thickness of about 0.8 millimeters. In some embodiments, Titanium with a thickness of about 0.45 millimeters of with a composite material of with a thickness of about 0.35 millimeters may be used to reduce the weight of the cover 42 further.

Nickel or other kind of electroless plating for the housing 38 may bed used to enable use of the aluminum in applications that do not need to be fire resistant. In other embodiments, Titanium with a thickness of about 0.45 millimeters combined with a composite or just metal honeycomb stiffeners may help meet the DO160 load requirements.

In other embodiments, CoreFlow may be used to create the integral cooling passageway 54, 254 in the base plate 46, 246. The process provides the ability to produce internal cooling passageways in cylinders/tubes.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A propulsion system for use with an aircraft, the propulsion system comprising:

a gas turbine engine including a compressor, a combustor, and a turbine, an electric power system including a generator coupled to the gas turbine engine to generate electrical energy, power electronics connected to the generator to receive the electrical energy from the generator, wherein the power electronics are configured to convert the electrical energy for transferring the electrical energy between components of the electric power system, and a motor configured to produce rotational energy in response to receiving electric energy from the power electronics, and at least one propulsor configured to use rotational energy received from the motor of the electric power system to generate thrust for propelling the aircraft, wherein the power electronics includes electrical components and a housing integrated with thermal management features and shock load reinforcement using ultrasonic additive manufacturing to protect the electrical components, the housing including (i) a base comprising a composite material of a first metallic material and ceramic fibers and the base formed to include a cooling passageway that extends therethrough to transfer a flow of cooling fluid through the base to cool the electrical components mounted to the base, (ii) a cover comprising a second metallic material that extends over the electrical components mounted to the base, and (iii) vibration dampers that extend between and interconnect the base to the aircraft to minimize the vibrations transferred to the base and the cover, wherein the base of the housing includes a base plate comprising the composite material of the first metallic material and ceramic fibers and formed to define the cooling passageway, a heat shield comprising a third metallic material having a thermal resistance greater than the first metallic material that extends around an outer surface of the base plate to protect the base plate from high external temperatures, and at least one heat transfer pedestal located in a cavity formed in the base plate that is in fluid communication with the cooling passageway, wherein the base plate has first localized areas of the first metallic material that are free of ceramic fibers and second localized areas of the ceramic fibers that extend around the first localized areas of the first metallic material on the base plate to provide increased stiffness to the base plate, and wherein the electrical components are coupled to the base plate at the first localized areas and the cooling passageway is located in one of the first localized areas of the first metallic material on the base plate.

2. The system of claim 1, wherein the at least one heat transfer pedestal includes a plate that is flush with an inner surface of the base plate to close an opening to the cavity and a plurality of fins that extend from the plate into the cavity so as to be in fluid communication with the cooling fluid, and the plate comprising the first metallic material and the plurality of fins comprising a fourth metallic material that has a thermal resistance less than the first metallic material to transfer heat from the plate to the cooling fluid.

3. The system of claim 2, wherein the plate includes an embedded temperature sensor configured to measure the temperature of the electrical components mounted to an outer surface of the plate.

4. The system of claim 1, further comprising a plurality of sensors that are each embedded in the base plate.

5. The system of claim 4, wherein at least one sensor of the plurality of sensors is temperature sensor embedded in the base plate proximate to an inner surface of the base plate and configured to measure the temperature of the electrical components mounted to the base.

6. The system of claim 4, wherein at least one sensor of the plurality of sensors is a strain gauge configured to measure the strain in the base plate.

7. The system of claim 1, wherein the cover comprises layers of electromagnetic shielding material integrated with the second metallic material to protect the electrical components from electromagnetic interference.

8. A propulsion system for use with an aircraft, the propulsion system comprising:
   an electric power system including a generator configured to generate electrical energy, power electronics connected to the generator to receive the electrical energy from the generator, wherein the power electronics is configured to convert the electrical energy for transferring the electrical energy between components of the electric power system, and a motor configured to produce rotational energy in response to receiving electric energy, and
   at least one propulsor coupled to the electric power system to generate thrust for propelling the aircraft,
   wherein the power electronics includes electrical components and a housing configured to mount the electrical components to the aircraft, the housing including (i) a base comprising a composite material of a first metallic material and ceramic fibers and the base formed to include a cooling passageway that extends therethrough to transfer a flow of cooling fluid through the base to cool the electrical components mounted to the base and (ii) a cover comprising a second metallic material that extends over the electrical components mounted to the base,
   wherein the base of the housing includes a base plate comprising the composite material and formed to define the cooling passageway and a heat shield comprising a third metallic material having a thermal resistance greater than the first metallic material that extends around an outer surface of the base plate to protect the base plate from high external temperatures,
   wherein the base plate has first localized areas of the first metallic material that are free of ceramic fibers and second localized areas of the ceramic fibers that extend around the first localized areas of the first metallic material on the base plate to provide increased stiffness to the base plate, and
   wherein the electrical components are coupled to the base plate at the first localized areas and the cooling passageway is located in one of the first localized areas of the first metallic material on the base plate.

9. The system of claim 8, wherein the base of the housing further includes at least one heat transfer pedestal located in a cavity formed in the base plate that is in fluid communication with the cooling passageway, the at least one heat transfer pedestal including a plate that is flush with an inner surface of the base plate to close an opening to the cavity and a plurality of fins that extend from the plate into the cavity so as to be in fluid communication with the cooling fluid, and the plurality of fins comprising a fourth metallic material that has a thermal resistance less than the first metallic material to transfer heat from the plate to the cooling fluid.

10. The system of claim 9, wherein the plate includes an embedded temperature sensor configured to measure the temperature of the electrical components mounted to an outer surface of the plate.

11. The system of claim 8, wherein the base plate is formed to define a plurality of fins comprising a fourth metallic material that extend into the cooling passageway, and the fourth metallic material having a thermal resistance less than the first metallic material.

12. The system of claim 8, further comprising a plurality of sensors that are each embedded in the base.

13. The system of claim 12, wherein at least one sensor of the plurality of sensors is a temperature sensor embedded in the base proximate to an inner surface of the base and configured to measure the temperature of the electrical components mounted to the base.

14. The system of claim 12, wherein at least one sensor of the plurality of sensors is a strain gauge configured to measure the strain in the base.

15. A housing adapted to house electrical components for an aircraft made by a process comprising the steps of:
   ultrasonically welding layers of a first metallic material to begin forming a base plate of the housing,
   ultrasonically welding layers of the ceramic fibers between the layers of the first metallic material in different localized areas to increase stiffness in the base plate,
   repeating the steps of welding layers of the first metallic material and welding layers of the ceramic fibers until the base plate has a first predetermined thickness,
   machining a cooling passageway into the layers of the first metallic material of the base plate that are free of any ceramic fiber material therebetween after welding the layers of the first metallic material and welding the layers of ceramic fibers to the first predetermined thickness,
   filling the cooling passageway with a water soluble material, and
   repeating the steps of welding layers of the first metallic material and welding layers of the ceramic fibers until the base plate has a second predetermined thickness that is greater than the first predetermined thickness, and
   wherein the base plate once formed has first localized areas of the first metallic material that are free of ceramic fibers and second localized areas of the ceramic fibers that extend around the first localized areas of the first metallic material on the base plate, and
   wherein the process further comprises coupling the electrical components to the base plate of the housing to localized areas that are free of ceramic fibers once the base plate has the second predetermined thickness.

16. The housing of claim 15, wherein the process further comprises
- machining a cavity into the layers of the first metallic material of the base plate that are free of any ceramic fiber material therebetween after welding the layers of the first metallic material and welding the layers of the ceramic fibers to the second predetermined thickness, wherein the cavity opens into a part of the cooling passageway,
- welding layers of the first metallic material separate from the base plate of the housing to form a plate with a predetermined thickness,
- welding layers of a second metallic material to the plate to a top surface of the layers of the first metallic material until the layers of the second metallic material has a predetermined height,
- machining the layers of the second metallic material to form a plurality of fins that extends away from the plate to create a heat exchanger pedestal, and
- arranging the heat exchanger pedestal in the cavity so that the plate is flush with an inner surface of the base plate and the plurality of fins extend into the cavity.

17. The housing of claim 15, the process further comprising
- welding layers of a second metallic material to the layers of the first metallic material in localized areas that are separate from the localized areas with ceramic fibers between the steps of welding layers of the first metallic material and welding layers of the ceramic fibers until the base plate has the first predetermined thickness,
- machining a plurality of grooves into the layers of the second metallic material to form a plurality of fins after machining the cooling passageway,
- filling the plurality of grooves with the water soluble material, and
- welding layers of the first metallic material over the plurality of fins to close the plurality of grooves and the cooling passageway.

18. The housing of claim 15, the process further comprising embedding at least one sensor between layers of the first metallic material of the base plate.

* * * * *